(12) United States Patent
Carlsen et al.

(10) Patent No.: US 7,795,890 B2
(45) Date of Patent: Sep. 14, 2010

(54) REDUCED GROUND SPRING PROBE ARRAY AND METHOD FOR CONTROLLING SIGNAL SPRING PROBE IMPEDANCE

(75) Inventors: Richard D. Carlsen, Mesa, AZ (US); David Moore, Portland, OR (US); Shawn Van Haren, Gilbert, AZ (US)

(73) Assignee: Integrated Test Arizona, Gilbert, AZ (US)

( * ) Notice: Subject to any disclaimer, the term of this patent is extended or adjusted under 35 U.S.C. 154(b) by 0 days.

(21) Appl. No.: 12/135,427

(22) Filed: Jun. 9, 2008

(65) Prior Publication Data
US 2009/0302877 A1 Dec. 10, 2009

(51) Int. Cl.
*G01R 31/02* (2006.01)
(52) U.S. Cl. .................. 324/754; 324/758; 324/761
(58) Field of Classification Search .................. None
See application file for complete search history.

(56) References Cited

U.S. PATENT DOCUMENTS

| | | | |
|---|---|---|---|
| 5,175,493 A | | 12/1992 | Langgard |
| 5,283,518 A | * | 2/1994 | King et al. .................. 324/761 |
| 5,585,739 A | | 12/1996 | Staab |
| 5,703,494 A | * | 12/1997 | Sano .................. 324/761 |
| 6,498,506 B1 | | 12/2002 | Beckous |
| 6,902,416 B2 | * | 6/2005 | Feldman .................. 439/219 |
| 7,015,708 B2 | | 3/2006 | Beckous et al. |
| 2005/0231221 A1 | | 10/2005 | Cannon |

OTHER PUBLICATIONS

Signal Integrity Model A1520 Description; Jan. 2007; 4 pgs.; Signal Integrity, Inc., Attleboro, MA, USA.
"IPC-D-317A Design Guidelines for Electronic Packaging Utilizing High-Speed Techniques"; Jan. 1995; 2 pgs.; The Institute for Interconnecting and Packaging Electronic Circuits, Northbrook, IL, USA.

* cited by examiner

*Primary Examiner*—Minh N Tang
(74) *Attorney, Agent, or Firm*—David W. Carstens; Carstens & Cahoon, LLP

(57) ABSTRACT

A reduced ground spring probe array and a method for controlling the impedance of the signal spring probes in the reduced ground spring probe array. Signal spring probes are positioned in a row-column format across the surface of the spring probe tower. Ground spring probes are positioned in a row/alternating-column format across the surface of the spring probe tower such that one ground probe is positioned between two or more signal probes. In doing so, a void space exists for every other ground probe column such that one or more signal lines may be routed within the void space or the array may be compressed to establish a smaller overall spring probe tower footprint.

12 Claims, 3 Drawing Sheets

REDUCED GROUND SPRING PROBE ARRAY AND METHOD FOR CONTROLLING SIGNAL SPRING PROBE IMPEDANCE

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to semiconductor test fixtures, and, more specifically, to a method for controlling the impedance of signal spring probes in a semiconductor test fixture spring probe array through the placement of ground spring probes.

2. Description of Related Art Including Information Disclosed under 37 CFR 1.97 and 1.98

The semiconductor test industry uses an interface to transfer signals from a device under test (DUT) to a test system. This device typically contains thousands of transistors that are to be tested. The interface between the DUT and the test system comprises a spring probe array that affords a temporary connection between the DUT and the system.

FIG. 1 shows a traditional spring probe array tower with its arrays of spring probes projecting upwards. A typical test setup utilizes a spring probe array with a multitude of spring probes for contacting the DUT. Test signals flow between the test setup and the DUT across the probe connections. Quite often, this device testing requires that the signal impedance be tightly controlled between the DUT and the test system. This is necessary when dealing with high circuit frequencies or when power transfer between the devices must be maximized. Improper impedance can cause reflected signals which interfere with circuit measurements.

The spring probe array includes signal probes and ground probes. FIG. 2 depicts the ground and signal spring probe placement of the traditional spring probe array. Ground probes are spaced appropriately among the signal probes to influence the signal probe impedance. Traditional probe arrays require such a high number of ground probes that a physical limitation is imposed on the possible number of signal probes. This further imposes a limitation on the number of transistors that can be tested.

When a DUT is placed in a test fixture, the spring probe array tower is held in contact with the circuit connections. The test fixture must compress the spring probe array tower sufficiently to establish adequate circuit contact. Test systems with interface compression force limits periodically suffer from lack of sufficient signal spring probes through the interface due to the large number of ground spring probes used to control the impedance of the signals. This is because each spring probe requires some amount of force to compress the probe against the DUT to obtain sufficient contact. The overall test system compression force required is directly proportional to the number of spring probes. In a typical spring probe array, the forces required to adequately compress the multitude of spring probes contacting the DUT can often exceed the test fixture compression force limits.

Accordingly, a need exists for a signal spring probe array that allows a reduced number of ground spring probes to control the impedance of the same or an increased number of signal spring probes. Further, a need exists for a spring probe array that provides a greater number of signal spring probes without exceeding tester compression force limits.

BRIEF SUMMARY OF THE INVENTION

The present invention provides a method for controlling the impedance of signal spring probes in a spring probe array while reducing the overall count of ground spring probes. The signal spring probes are spaced evenly in a row-column configuration across the surface of the spring probe array. Ground spring probes are placed in the array in an offset row/staggered-column configuration, such that each ground spring probe is located in the center of a cluster of four signal spring probes. The columns of ground probes in the array are staggered such that every other column is devoid of ground probes. This void column allows the spring probe array to be reduced in size or allows for passage of additional circuit traces.

Spacing between each ground spring probe and the adjacent signal spring probes influences the signal spring probe impedance. The spacing is determined by the desired impedance, the probe diameter, and the dielectric constant of the material used in the array block. Each ground probe influences the impedance of two or more signal probes.

These and other improvements will become apparent when the following detailed disclosure is read in light of the supplied drawings. This summary is not intended to limit the scope of the invention to any particular described embodiment or feature. It is merely intended to briefly describe some of the key features to allow a reader to quickly ascertain the subject matter of this disclosure. The scope of the invention is defined solely by the accompanying claims.

BRIEF DESCRIPTION OF THE SEVERAL VIEWS OF THE DRAWING(S)

The present invention will be more fully understood by reference to the following detailed description of the preferred embodiments of the present invention when read in conjunction with the accompanying drawings, wherein.

Figure 1:
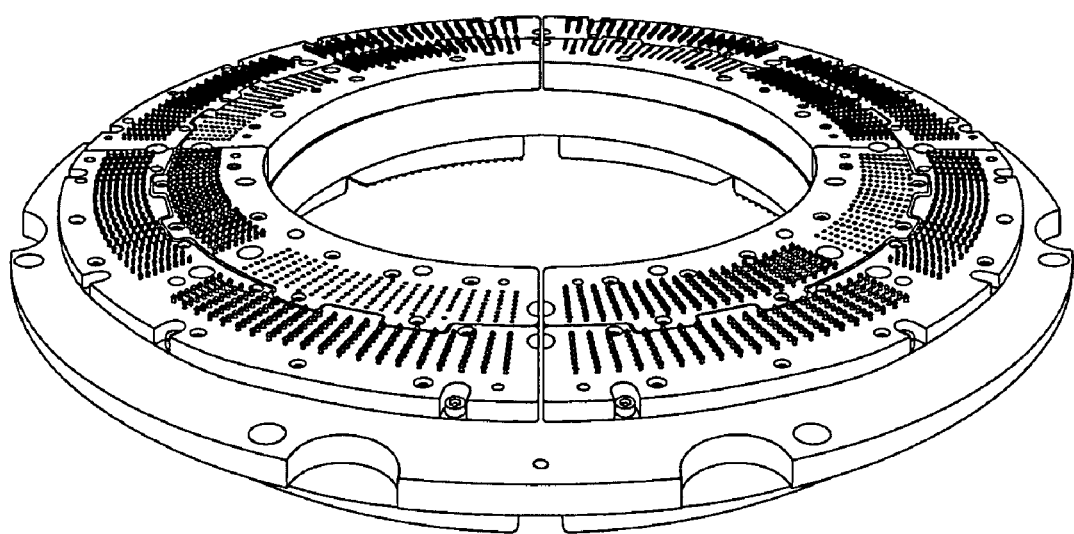
FIG. 1 is a depiction of a typical prior art spring probe array tower.

The above figures are provided for the purpose of illustration and description only, and are not intended to define the limits of the disclosed invention. Use of the same reference number in multiple figures is intended to designate the same or similar parts. Furthermore, if the terms "top," "bottom," "first," "second," "upper," "lower," "height," "width," "length," "end," "side," "horizontal," "vertical," and similar terms are used herein, it should be understood that these terms have reference only to the structure shown in the drawing and are utilized only to facilitate describing the particular embodiment. The extension of the figures with respect to number, position, relationship, and dimensions of the parts to form the preferred embodiment will be explained or will be within the skill of the art after the following teachings of the present invention have been read and understood. (58,266).

DETAILED DESCRIPTION OF THE INVENTION

Figure 3:
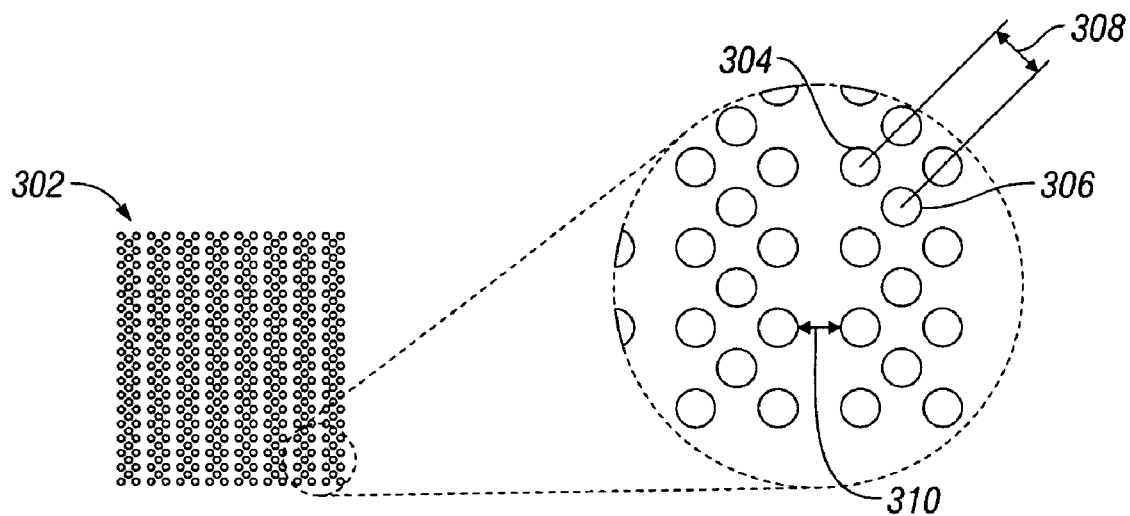
FIG. 3 is a depiction of a preferred embodiment of the present invention with a magnified portion to more clearly depict the inventive placement of the signal and ground spring probes.
Figure 4:
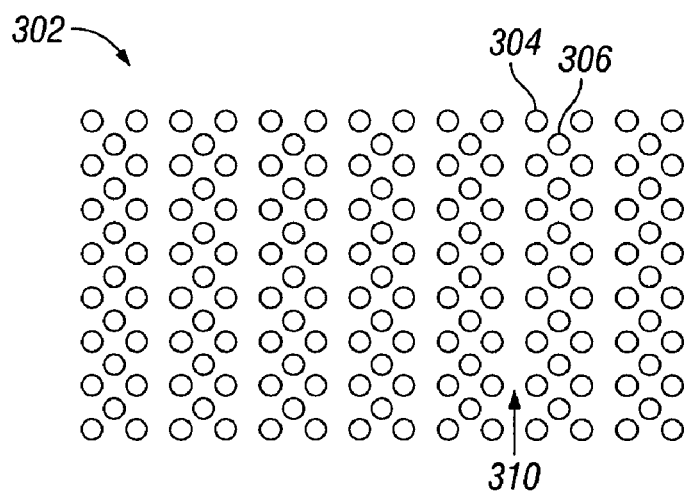
FIG. 4 is a close-up illustration of the novel ground and signal spring probe placement of the present invention.

Referring to FIG. 3 and FIG. 4, a preferred embodiment of the present invention is shown. An array of spring probes (302) is depicted along with magnification of the key features. The array in this embodiment comprises both signal spring probes (304) and ground spring probes (306). The spring probes utilized are of the industry standard variety. The structure supporting the spring probes and forming the body of the array tower is typically constructed from some type of thermosetting resin. Different resins possess differing dielectric constants. Glass-filled resins may also be utilized depending on the dielectric constant requirement of a given application.

The signal spring probes (304) in this embodiment are aligned in a coplanar parallel row-column configuration in the array (302). To influence or control the impedance of the signal probes (304), the ground spring probes (306) are positioned between the signal probes (304) such that each ground probe is substantially centered within clusters of four signal probes. The distance between each ground probe and adjacent signal probe (308) establishes the impedance of the adjacent signal probe. Because each ground probe can influence the impedance of up to four signal probes, every other column of ground probes may be omitted as shown in FIG. 4. This arrangement of ground probes is known as a row/alternating-column configuration.

By alternating the ground signal probe columns as such, a void column (310) is established between every other two columns of signal probes. This void column (310) space allows for the routing of additional circuit board traces if necessary. Further, this space may also allow for a possible reduction in the overall size of the spring probe array by allowing the distance between adjacent columns of signal probes to be reduced.

In this configuration, the signal spring probe (304) impedance is affected by the distance (308) between it and the local ground probe (306). Depending on its location in the array, one ground probe (306) can influence the impedance of two to four signal probes. The diameter of the probes and the dielectric constant of the material in which probes are supported determine the overall impedance experienced by a given signal probe (304).

Figure 2:
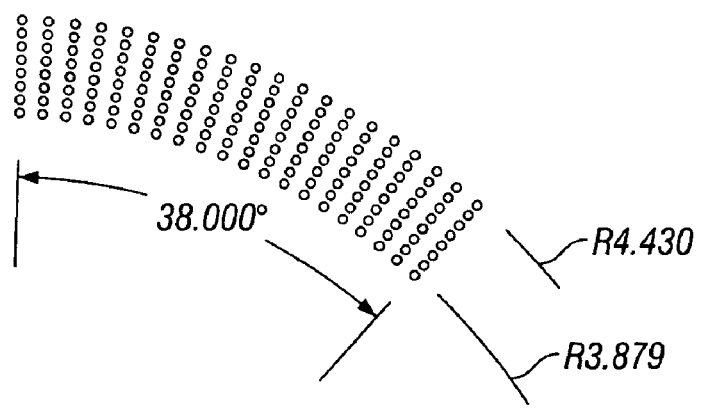
FIG. 2 is a depiction of the ground and signal spring probe placement of the typical prior art spring probe array of FIG. 1.
Figure 5:
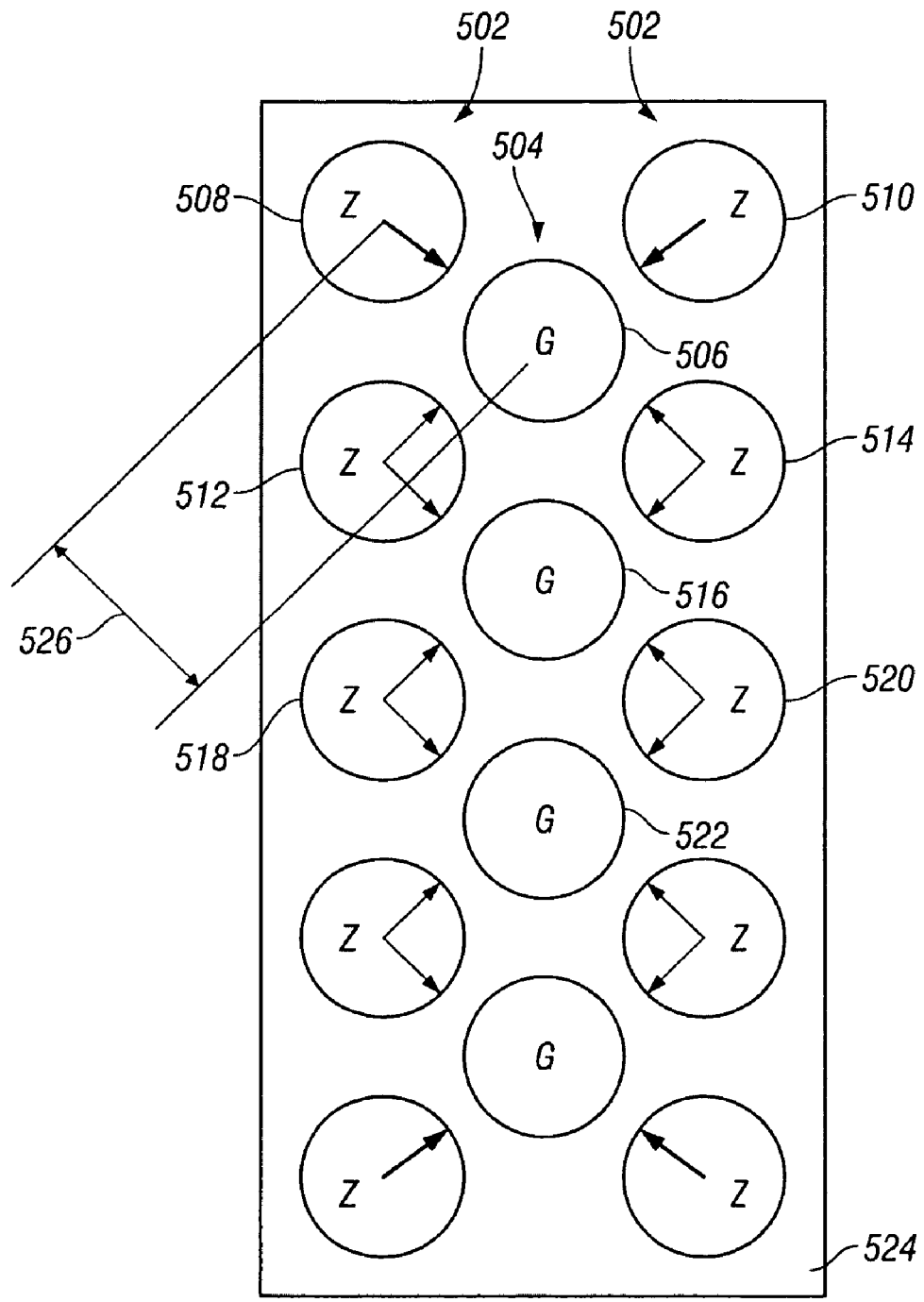
FIG. 5 is an illustration of how the impedance of the signal spring probes is influenced by the various local ground spring probes, with the impedance represented by the arrows and the letter Z.

As shown by prior art FIG. 1 and FIG. 2, the traditional method for controlling the impedance of the signal spring probes was to place a row of ground probes between each row of signal spring probes. This even row-column spacing of the signal and ground probes requires a significant amount of surface area, resulting in large probe array towers. In the present invention, as depicted in FIG. 3 and FIG. 4, every other column of ground probes is omitted and the remaining columns of ground probes are shifted such that each ground probe (306) is centered between four signal probes (304) in a row/alternating-column configuration. FIG. 5 depicts the influence of each ground probe on signal probe impedance in further detail.

Referring to FIG. 5, each ground spring probe column (504) in this configuration influences the impedance of the surrounding signal spring probes (502). For example, a ground probe at the outer end of the array (506) influences the impedance of the four surrounding signal spring probes (508, 510, 512, and 514). This ground probe (506), however, has a more profound influence on the two outer signal probes (508 and 510) than it does on the inner signal probes (512 and 514). The inner signal probes (512 and 514) are also influenced by the inner ground probe (516). This inner ground probe also influences the other two inner signal probes (518 and 520) to a smaller extent because they are also influenced by the next inner ground probe (522). Thus, the spacing (526) between the ground probe and the adjacent signal probes is adjusted to achieve the proper signal probe impedance. As mentioned previously, this calculation also considers the diameter of the ground probe in conjunction with the dielectric constant of the array tower (524). This calculation is typical in the industry and is within the knowledge and abilities of one having ordinary skill in the art.

The spring probe array is mounted in a block which is eventually mounted in a spring probe array tower for use in a test fixture. This spring probe array block serves as a spring probe support device and is typically a thermosetting resin material having determinate dielectric properties. The dielectric coefficient of this material is used in the signal spring impedance calculations. Use of different materials having differing coefficients can influence the overall size of the spring probe array.

The traditional method of calculating the approximate impedance of a round signal wire near a ground wire is demonstrated by the impedance formula as presented in the *Design Guidelines for Electronic Packaging Utilizing High-Speed Techniques* by the Institute for Interconnecting and Packaging Electronic Circuits. This commonly used impedance equation is as follows:

$$Zo = \frac{60}{\sqrt{Er}} \times \ln\left(\frac{4H}{d}\right) \quad \text{(Math. 1)}$$

Where:
Zo=Characteristic Impedance
Er=Effective relative permittivity of the medium between the wire and ground
H=Distance between the center of the wire and the surface of the nearest ground
d=Diameter of the wire This equation (Math. 1) may be adjusted slightly to satisfy impedance calculations in the present invention. The mathematical equation for calculating the impedance of signal spring probes near adjacent parallel ground spring probes in the present invention is as follows:

$$Zo = \frac{60}{\sqrt{Er}} \times \ln\left(\frac{4\left(H - \frac{d}{2}\right)}{d}\right) \quad \text{(Math. 2)}$$

Where:

Zo=Characteristic Impedance

Er=Effective relative permittivity of the medium between the signal and ground spring probes H=Distance between the centers of the signal and adjacent ground spring probes d=Diameter of spring probes This equation (Math. 2) is derived from the traditional equation (Math. 1), and is modified to account for the radius of the cylindrical ground probe as measured center-to-center. This equation (Math. 2) further assumes that the signal and ground spring probes are approximately the same diameter.

In yet another embodiment the signal spring probes are aligned in a row-column configuration such that the rows are located along the perimeter of concentric circles and the columns are located along the radius. The ground spring probes are placed between the signal probes as before, with a resulting periodic void column between every other pair of signal probe columns.

One skilled in the art will appreciate that other configurations are possible and are within the scope of the present invention. For example, the array need not be limited to a strict row-column configuration. Instead, clusters of ground and signal spring probes may be established such that a ground spring probe influences the impedance of two to four adjacent signal spring probes.

The invention may be embodied in other specific forms without departing from the spirit or essential characteristics thereof. The present embodiments are therefore to be considered in all respects as illustrative and not restrictive. Accordingly, the scope of the invention is established by the appended claims rather than by the foregoing description. All changes which come within the meaning and range of equivalency of the claims are therefore intended to be embraced therein. Further, the recitation of method steps does not denote a particular sequence for execution of the steps. Such method steps may therefore be performed in a sequence other than that recited unless the particular claim expressly states otherwise. (58,266).

We claim:

1. A reduced ground spring probe array for use in a semiconductor test fixture wherein a plurality of spring probes provide electrical continuity between a DUT and a test system, the array comprising:
   a spring probe support device, the device having a first surface for supporting said spring probes;
   a plurality of signal spring probes, wherein the signal probes are affixed to the first surface; and
   a plurality of ground spring probes, wherein the ground probes are affixed to the first surface and positioned such that each ground probe is substantially centered within a cluster of four signal probes, and wherein the impedance of at least two signal probes is controlled by a single ground probe,
   wherein a reduction of the overall number of said ground probes positioned in such manner has the result of controlling signal impedance between said DUT and said test system.

2. The array of claim 1 wherein the signal probes are arranged in a parallel row-column configuration and the ground probes are configured in a row/alternating-column array.

3. The array of claim 2, the array further comprising at least one signal trace, wherein the trace passes in the area between two signal probe columns having no ground probes between them.

4. The array of claim 1 wherein the signal probes are arranged in a row-column configuration with a plurality of rows defining a plurality of concentric circles and a plurality of columns defining a plurality of radii of said concentric circles.

5. The array of claim 4 wherein the ground probes are configured in a row/alternating-column array.

6. A method for providing a reduced ground spring probe array for use in semiconductor test fixtures wherein spring probes provide electrical continuity between a DUT and a test system, the method comprising:
   providing a spring probe support device, the spring probe support device having a first surface for supporting spring probes;
   providing a plurality of signal spring probes, wherein the signal probes are affixed to the first surface;
   providing a plurality of ground spring probes, wherein the ground probes are affixed to the first surface and spaced such that each ground probe is substantially centered within a cluster of four signal probes; and
   establishing the impedance of at least two signal probes by setting the distance between the at least two signal probes and the adjacent at least one ground probe,
   wherein a reduction of the overall number of said ground probes positioned in such manner has the result of controlling signal impedance between said DUT and said test system.

7. The method of claim 6 wherein the signal probes are arranged in a parallel row-column configuration and the ground probes are configured in a row/alternating-column array.

8. The method of claim 7, the array further comprising at least one signal trace, wherein the trace passes in the area between two signal probe columns having no ground probes between them.

9. The method of claim 6 wherein the signal probes are arranged in a row-column configuration with a plurality of rows defining a plurality of concentric circles and a plurality of columns defining a plurality of radii of said concentric circles.

10. The method of claim 9 wherein the ground probes are configured in a row/alternating column array.

11. A method for controlling the impedance of signal spring probes in a spring probe array for use in a semiconductor test fixture wherein the spring probes provide electrical continuity between a DUT and a test system, the method comprising:
   providing a plurality of signal spring probes, wherein the signal probes are arranged in a parallel row-column configuration; and
   providing a plurality of ground spring probes, wherein the ground probes are arranged in a parallel row/alternating column configuration, and wherein each ground probe is located in the approximate center of a cluster of four signal probes, and wherein the distance between each ground probe and each adjacent signal probe influences the impedance of each adjacent signal probe,
   wherein a reduction of the overall number of said ground probes positioned in such manner has the result of controlling signal impedance between said DUT and said test system.

12. The method of claim 11, the array further comprising at least one signal trace, wherein the trace passes in the area between two signal probe columns having no ground probes between them.

* * * * *